United States Patent
Kimoto et al.

[11] Patent Number: 6,150,657
[45] Date of Patent: Nov. 21, 2000

[54] ENERGY FILTER AND ELECTRON MICROSCOPE EQUIPPED WITH THE ENERGY FILTER

[75] Inventors: Koji Kimoto, Hitachi; Yoshifumi Taniguchi, Hitachinaka; Shunroku Taya, Mito; Shigeto Isakozawa, Hitachinaka; Takashi Aoyama, Tokai-mura; Masakazu Saito, Mobara; Tomoko Sekiguchi, Hachioji, all of Japan

[73] Assignee: Hitachi, Ltd., Tokyo, Japan

[21] Appl. No.: 09/138,995

[22] Filed: Aug. 25, 1998

[30] Foreign Application Priority Data

Aug. 28, 1997 [JP] Japan .................................. 9-232108

[51] Int. Cl.⁷ .................................................. H01J 49/46
[52] U.S. Cl. .................. 250/305; 250/311; 250/396 ML
[58] Field of Search ............................... 250/305, 396 R, 250/396 ML, 310, 311

[56] References Cited

U.S. PATENT DOCUMENTS

| | | | |
|---|---|---|---|
| 5,449,914 | 9/1995 | Rose et al. | 250/305 |
| 5,811,801 | 9/1998 | Tsuno | 250/305 |
| 5,952,656 | 4/1999 | Kaneyama | 250/305 |
| 5,955,732 | 9/1999 | Tsuno | 250/305 |

FOREIGN PATENT DOCUMENTS

| | | |
|---|---|---|
| 62-66553 | 3/1987 | Japan . |
| 62-69456 | 3/1987 | Japan . |
| 642358B2 | 6/1994 | Japan . |
| 737536 | 2/1995 | Japan . |
| 836990 | 2/1996 | Japan . |

OTHER PUBLICATIONS

F.R. Egerton: Electron Energy–Loss Spectroscopy in the Electron Microscope, Plenum Press (1986), pp. 1–25.

Ludwig Reimer Ed.: Energy–Filtering Transmission Electron Microscopy, Springer (1995), pp. 1–42.

J.C.H. Spence and J.M. Zuo: Electron Microdiffraction, Plenum Press (1992), pp. 213–244.

O.L. Krivanek, A.J. Gubbens and N. Dellby: Microsc. Microanal. Microstruct. 2(1991), pp. 315–332.

N. Ajika, H. Hashimoto, K. Yamaguchi and H. Endoh: Japanese Journal of Applied Physics, 24 (1985), pp. L41–L44.

Computer Program "Trio" for Third Order Calculation of Ion Trajectory by Akekiyo Matsuo et al.: Mass Spectroscopy, vol. 24 No. 1, Mar. 1976, pp. 19–62.

*Primary Examiner*—Kiet T. Nguyen
*Attorney, Agent, or Firm*—Kenyon & Kenyon

[57] ABSTRACT

An energy filter has a plurality of deflection means and is constructed by using the plural deflection means so that an average track of an electron beam is symmetric and the normal line to a symmetric plane is inclined against an incident direction of the electron beam.

15 Claims, 7 Drawing Sheets

$\alpha_1 + \alpha_2 + \alpha_3 = 270°$ $\alpha_1 + \alpha_2 + \alpha_3 = 450°$

100mm

100mm

ENERGY FILTER AND ELECTRON MICROSCOPE EQUIPPED WITH THE ENERGY FILTER

BACKGROUND OF THE INVENTION

The present invention relates to an electron spectrometer or energy filter which selects electrons of specific energy and forms an image and, more particularly, to an energy filter for a transmission electron microscope and an electron microscope provided with the energy filter.

In recent years, in the field of electrical, magnetic and structural materials as well as semiconductor devices, a fine structure in a material has been related to electrical, magnetic and mechanical properties of the material. Therefore, the technique of measuring and evaluating at a high spatial resolution is important as a basic technique for material development. A transmission electron microscope (TEM) is one of the measuring techniques having a high spatial resolution. Further, in order to not only observe micro structures but obtain knowledge of elemental analysis, chemical bonding analysis, etc., an electron energy loss spectroscopy (EELS) which analyzes the energy of electrons transmitted through the specimen is used (R. F. Egerton: Electron Energy-Loss Spectroscopy in the Electron Microscope. Plenum Press (1986)). Among the electron energy loss spectroscopys, a method in which an imaging energy filter is provided and the transmission electrons are two-dimensionally dispersed of energy is called an energy filtering transmission electron microscopy (EF-TEM (L. Reimer Ed: Energy-Filtering Transmission Electron Microscopy, Springer (1995))), and it is effective as a material evaluation method from the following two viewpoints:

(1) By separating inelastic scattering electrons which were background, an image and diffraction pattern of only zero loss electrons is obtained and quantitative evaluation of strength becomes possible (J. C. H. Spence and J. M. Zuo: Electron Microdiffraction, Plenum Press (1992)).

(2) By observing the inelastic scattering electrons, it is possible to two-dimensionally detect information such as elemental analysis and chemical analysis.

The energy-filteing transmission electron microscope can be classified as a type (in-column type) in which an energy filter is incorporated within the column of the electron microscope and as a type (post-column type) in which the energy filter is added to the rear portion of the microscope column.

An example of the in-column type is a transmission electron microscope disclosed in JP B 6-42358. As for the post-column type energy filter, a system is known which is disclosed in the papers by O. L. Krivanek, et al (O. L. Krivanek, A. J. Gubbens and N. Dellby: Microsc. Microanal. Microstruct. 2 (1991), 315.), for example. Features of the conventional technique are described hereunder regarding both the in-column type and the post-column type.

(a) A Conventional In-column Type Energy Filter

FIG. 5 is a schematic diagram of an electron microscope provided with a conventional in-column type energy filter. The electron microscope has a construction in which the energy filter is positioned between an intermediate lens system and a projection lens system.

An electron beam emitted from an electron gun is first accelerated by an accelerating voltage device. The electrons are converged by a condenser lens system, and fall on the specimen held by the specimen holder. The electron beam causes various interaction with the specimen, and a part of the electron beam loses partially its energy. An energy loss value depends on the interaction between the specimen and the electrons. The electron beam, having been transmitted through the specimen, is magnified by an objective lens and an intermediate lens system, and arrives at the in-column type energy filter. In this case, a final crossover of the intermediate lens system is formed on the crossover plane of the energy filter, and an image (for example, electron microscope image and diffraction pattern) by the electron beam that is desired to be filtered is formed on the incident image plane. Inside the in-column type energy filter, different tracks are generated according to the energy. In FIG. 5, an average track of electrons is expressed by a curved line. Since the average track draws a Greek letter $\Omega$, the energy filter is also called an $\Omega$ filter. As for the in-column type energy filter generating an electron track of the $\Omega$ type, JP A 62-66552 is known, for example. The electron beam from the crossover is converged at different positions on the energy dispersion plane depending on an energy loss value. Accordingly, on the energy dispersion plane, a spectrum corresponding to a quantity of electron energy loss, that is, an electron energy-loss spectrum is formed. Further, the electron beam from the incident image plane forms again an image on an achromatic image plane. Since an electron beam of different energy also forms an image at the same position (there is no energy dispersion), the image plane is called an achromatic image plane. The electron beam, having passed through the in-column type energy filter, is magnified by the projection lens system and projected on a fluorescent screen, an image recording device, etc., provided in a viewing chamber. The projection lens system and an energy slit have the following two functions according to objects:

One of the functions is to observe an energy filtered image by selecting electrons of interest energy and projecting the achromatic image plane on the fluorescent screen (or the image recording device). The other function is to measure an electron energy-loss spectrum by projecting electrons created on the energy dispersion plane onto the fluorescent screen (or the image recording device) without using the energy selection slit.

The $\Omega$ type track of electron beams within the in-column type energy filter can be achieved by using a plurality of electron spectrometers combined with each other. In this prior art, four magnetic sectors are used. The magnetic sector is an object to disperse electrons by utilizing the principle that the rotation radius of electrons in the magnetic field depends on the energy of electron.

The major feature of the conventional in-column type energy filter is in that the tracks of electron beams inside the energy filter are symmetric with respect to a symmetric plane. It is known that distortion of the image on the achromatic image plane is reduced owing to the symmetry of the track of electron beam, and this is an electron optics advantage of the in-column type. Further, a common feature to the conventional in-column type energy filter is in that a normal line to the symmetric plane and the direction of electrons incident on the energy filter are parallel to each other. This is for causing the direction of electrons incident on the energy filter and the direction of exit electrons to be the same. Of the in-column type energy filters, in addition to the energy filter generating the $\Omega$ type track shown in this figure, there are an energy filter in which an average track drawn by electrons is a $\alpha$ type (JP A 62-69456, JP A 7-37536, JP A 8-3699), a Castaing-Henry type energy filter in which an electrostatic mirror and a magnetic sector are combined, etc., however, all of them have the feature that an average track of electron beams is symmetric with respect to the symmetric plane and the normal line to the symmetric plane is parallel with the direction of incidence of the electron beams.

(b) Conventional Post-column Type Energy Filter

FIG. 6 is a schematic diagram of an electron microscope provided with a conventional post-column type energy filter. Optical components of the electron microscope from an electron gun to an image recording means are already known as a transmission electron microscope. A portion added to the rear portion of the electron microscope is a post-column type energy filter.

By retracting a fluorescent screen and the image recording device out of an optical axis of electron beams, the electron beams enter the post-column type energy filter. In the post-column type energy filter, energy dispersion is caused by a single magnetic sector. In this case, electrons from the crossover plane formed of a projection lens system disperse energy and are projected on an energy dispersion plane. The electron beams selected by an energy slit are magnified by multipole lenses and projected on an image detector. Those multipole lenses effects a similar operation to that of the projection lens system in the electron microscope with an in-column type energy filter, projects an image by the electrons selected by the energy slit onto the image detector and projects an energy loss spectrum on the energy dispersion plane onto the image detector.

The major feature of the conventional post-column type electron microscope is in that there is only one magnetic sector. Therefore, an achromatic image plane, which existed in the in-column type energy filter, is not formed by the single magnetic sector. Accordingly, it is necessary to form an achromatic image with the multipole lenses, etc. Further, it is already known that since an electron track has no symmetry, image distortions by the single magnetic sector are large (N. Ajika, H. Hashimoto, K. Yamaguchi and H. Endo: Japanese Journal of Applied Physics, 24 (1985), L 41). The multipole lenses requires the operations such as formation of an achromatic image and correction of distortion in image, so that the structure becomes more complex than the projection lens system in the in-column type energy filter system. In the above described papers (O. L. Krivanek et al (1991)), multipole lenses are 12 stages lenses comprising six stages of quadrupole and six stages of sextupole and are very complex.

SUMMARY OF THE INVENTION

An object of the invention is to provide an energy filter which is simple in construction and less in image distortion and an electron microscope using the energy filter. In the present invention, an energy filter which can be turned into a post-column type while keeping the electro-optical advantages of the in-column type is provided, so that almost all problems included in the conventional in-column type and post-column type energy filters can be solved.

Hereunder, subjects to be solved by the invention will be described in relation to the in-column type and post-column type energy filters.

(a) Subjects in Relation to the In-column Type Energy filter

Since an energy filter is incorporated in the column of an electron microscope, there is a problem that the instrument is made large in size. In the prior art shown in FIG. 5, it is noted from the conventional electron microscope that the height of the instrument is higher by the height corresponding to the energy filter and one stage of lens. This means that a condenser aperture and a specimen holder which are frequently operated by an operator at the time of observation are to be separated from an operation panel, whereby the operability is largely lost.

When the entire height of the electron microscope becomes high, the instrument is apt to be influenced by mechanical vibrations, and it is impossible to avoid reduction of spatial resolution due to vibrations of a specimen. Further, the center of gravity of the instrument becomes high, which is not preferable from a viewpoint of safety, either. In cases where the height of the instrument is close to 3 m, the instrument may not be installed in a regular laboratory.

Further, the energy dispersion, which is one of indications of the performance of the energy filter, becomes larger as the energy filter becomes larger, and it is inversely proportional to accelerating voltage (after relativistic correction). Therefore, in order to attain sufficient energy dispersion by a high accelerating voltage, it is necessary to make the energy filter large, whereby the instrument is made even larger in size. Therefore, such an in-column type energy filter of high accelerating voltage and an energy filter of large energy dispersion were difficult to develope.

Further, since the energy filter can not be additionally installed in an already made electron microscope, there is the problem that it lacks its adaptability. Particularly, in recent years, electron microscopes have not only been used for observation of magnified views but also in combination with various analyzers (for example, an energy dispersive X-ray spectroscopy and so on). Since the in-column energy filter is difficult to combine with an already-made instrument, an application field is limited to a very narrow one.

(b) Subjects in Relation to the Post-column Type Energy Filter

A problem of the post-column type energy filter is in that the instrument becomes complicated because complex multipole lenses for forming achromatic images and correcting distortion in the images are needed. When the instrument becomes complicated, alignment factors increase, which requires an operator to be very skilled. Particularly, since the multipole lens is not symmetric with respect to the axis, in cases where the axis is deviated from, it directly affects the distortion of an image. Therefore, the instrument lacks stability of performance and it is necessary to frequently adjust the axis.

Further, since only one magnetic sector is provided, distortion of an image is inherently large and the attained images may include large distortion.

As means for solving the above problems, in the present invention, an energy filter is provided in which an average track of an electron beam is symmetric with respect to a symmetric plane and the normal line of the symmetric plane is not parallel to a direction of incidence of the electron beam. That is, by making the average track of electron beam symmetric, it is possible to keep the electro-optical advantage of a conventional in-column type energy filter, and by inclining the normal line to the symmetric plane to the incident direction at an angle of 45°, it is possible to set a final deflection angle of electron beams to 90°, whereby such an advantage also can be provided that the energy filter can be installed in an already made electron microscope without modifying it, as in the conventional post-column type energy filter.

The means according to the present invention can solve the following problems.

First of all, the following problems of the conventional in-column type energy filter can be solved:

(1) Since the energy filter according to the present invention can be incorporated in any electron microscope, the restriction on expansibility which was a problem in the conventional in-column type is removed.

(2) Since the entire height of the electron microscope is not made higher by installing the energy filter under the viewing chamber, the problems accompanied by making the instrument large in scale are solved with the in-column type energy filter. Further, a general electron microscope has a space the height of which is typically 60 cm or more under the camera chamber (or the viewing chamber). Such a space allows an energy filter of sufficient performance (for example, energy dispersion of 1 μm/electron volt) to be provided for an electron microscope of 400 kv class or less which is used in general.

(3) With the instrument provided with the in-column type energy filter, an operator who does not need energy filter can utilize the function of the electron microscope without changing the function, without operating the energy filter. Further, since the condenser aperture and the position of the specimen holder are not changed, the above-mentioned problem of reduction in operability is solved.

Next, the following problems of the conventional post-column type energy filter are solved.

(1) Since an aberration correction using complicated multi-polar lenses is not needed, complicated axis adjustment is unnecessary and the operability is improved greatly. For example, in the conventional instrument, at least six factors (an achromatic image, x focus, y focus, spectrum distortion in an x direction, spectrum distortion in a y direction, and a ratio of length and breadth of an image) were required for the adjustment, however, the factors are reduced to 2 or so factors (an achromatic image, x focus).

(2) Since the energy filter itself has a function to cancel the aberration, distortion of the image becomes small on principle.

(3) The construction of the instrument becomes simple and the instrument can be produced at a low cost.

Further, in the present invention, an incident image on the fluorscent screen of electron microscope is reduced and projected on the entrance plane of the energy filter. Thereby the difference between the magnification on the fluorescent screen and the final observation magnification can be made small. As compared with the instrument in which an image about 20 times as large as the fluorescent screen was projected on the image detecting means in the conventional post-column energy filter, this means to provide a means which is able to reduce the magnification to less than that.

BRIEF DESCRIPTION OF THE DRAWINGS

FIG. 7(b) shows an example of a grating pattern projected on an achromatic image plane by a conventional post-column type, and FIG. 7(c) shows an example of a grating pattern projected according to the present invention; and FIGS. 8(a) and 8(b) each are a schematic diagram showing an energy filter shape, wherein FIG. 8(a) is an example of a conventional energy filter shape and FIG. 8(b) is an example of an energy filter shape according to the present invention.

Figure 1:
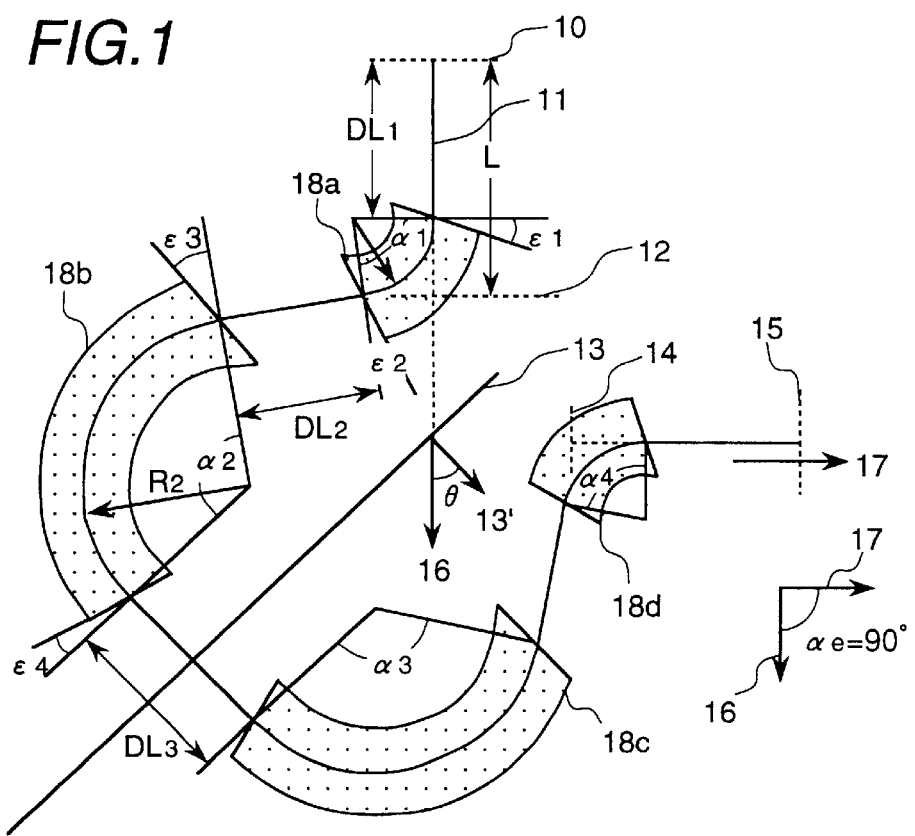
FIG. 1 is a schematic diagram of an energy filter of an embodiment of the present invention.

Numeral references in the figures each are denoted as follows:

10 . . . crossover plane, 11 . . . average track of an electron beam, 12 . . . entrance image plane, 13 . . . symmetric plane, 13' . . . normal line to the symmetric plane, 14 . . . achromatic image plane, 15 . . . energy dispersion plane, 6 . . . incident direction of an electron beam, outgoing direction of an electron beam, 18a, 18b, 18c, 18d . . . first, second, third, fourth spectrometer, 19a, 19b, 19c . . . first, second, third spectrometer, 21 . . . electron gun, 22 . . . electron beam, 23 . . . accelerating voltage device, 23' . . . accelerating electrode, 24 . . . condenser lens system, 25 . . . condenser aperture, 26 . . . specimen and specimen holder, 27 . . . objective aperture, 28 . . . objective lens, 29 . . . selected area aperture, 30 . . . intermediate and projection lens system, 31 . . . viewing chamber, 32 . . . camera chamber, 33 fluorescent screen, 34 . . . observing window, 35 . . . operation panel height, 36 . . . image recording device, 40 . . . energy slit, 41 . . . pre-filter lens system, 42 post-filter lens system, 43 . . . electron microscope image, 44 . . . image detector, 50 . . . in-column type energy filter, 51 . . . intermediate lens system, 52 . . . projection lens system, 53 . . . portion by which the height becomes higher than the conventional electron microscope, 60 . . . crossover plane by projection lens system, 61 . . . magnetic sector, 62a, 62b . . . multipole lenses.

DESCRIPTION OF EMBODIMENTS OF THE INVENTION

Embodiments of the present invention will be described hereunder, referring to the drawings.

FIG. 1 shows an embodiment of an energy filter according to the present invention. In this embodiment, the energy filter is composed of four (first, second, third and fourth) electron spectrometers (18a, 18b, 18c and 18d), and each electron spectrometer can generate a homogeneous magnetic field in the dotted region of the Figure.

An electron beam 11 emitted from a crossover plane 10 and having specific energy propagates a distance DL1 and is deflected at a radius R1 and an angle α1 by the first electron spectrometer 18a. The electron beam 11 further propagates a distance DL2 and arrives at the second electron spectrometer 18b, which deflects the electron beam 11 at a radius R2 and an angle α2. The electron beam 11 further propagates a distance DL3, and is deflected by the third and fourth electron spectrometers 18c and 18d in turn, and then the electron beam 11 goes out of the energy filter.

If an electron beam of different energy from the above-mentioned electron beam is emitted from the crossover plane 10, the rotation radius (R1, R2) is different, so that the electron beam generates an electron track different from the above average track 11 of the electron beam, and as a result it converges on a different position.

The average track 11 of electron beams deflected by the four electron spectrometers is symmetric with respect to the symmetric plane 13. The average track of electron beam described here means an average track in the vicinity of an optical axis, generated by electrons having energy to observe. By setting shape parameters such as the rotation radii (R1, R2) and the deflection angles ($\alpha$1, $\alpha$2) of the electron spectrometers, distances (DL2, DL3) between the electron spectrometers, angles ($\epsilon$1, $\epsilon$2, $\epsilon$3, $\epsilon$4) between the track of the electron beam and ends of magnetic poles to predetermined values, respectively, the electron beam emitted from the crossover plane 10 positioned at the place distant DL1 from the first electron spectrometer is converged at an energy dispersion plane 15 while dispersing energy, and electrons emitted from the incident image plane 12 distant L from the crossover plane 10 form an image on an achromatic image plane 14 without dispersing energy. In order to operate it as such a desired image formation type energy filter, it is impossible to take arbitrally the above-mentioned shape parameters. The shape parameters are necessary to be optimized by calculation, using a calculation program of electron beam track published in the papers (T. Matsuo, et al: Mass Spectroscopy 24(1976) 19–62), etc.

The feature of the present invention different from conventional energy filters is in that the average track 11 of electron beam is symmetric with respect to the symmetric plane 13 and the angle $\theta$ between the normal line 13' to the symmetric plane 13 and an incident direction 16 of the electron beam is $0°<\theta<90°$. In the energy filter of this embodiment, the angle between the incident direction 16 and the normal line 13' of the symmetric plane 13 is set to an angle of 45°, and the angle (final deflection angle) between the incident direction 16 of the electron beam and the outgoing direction 17 of the electron beam is set to 90°.

Figure 5:
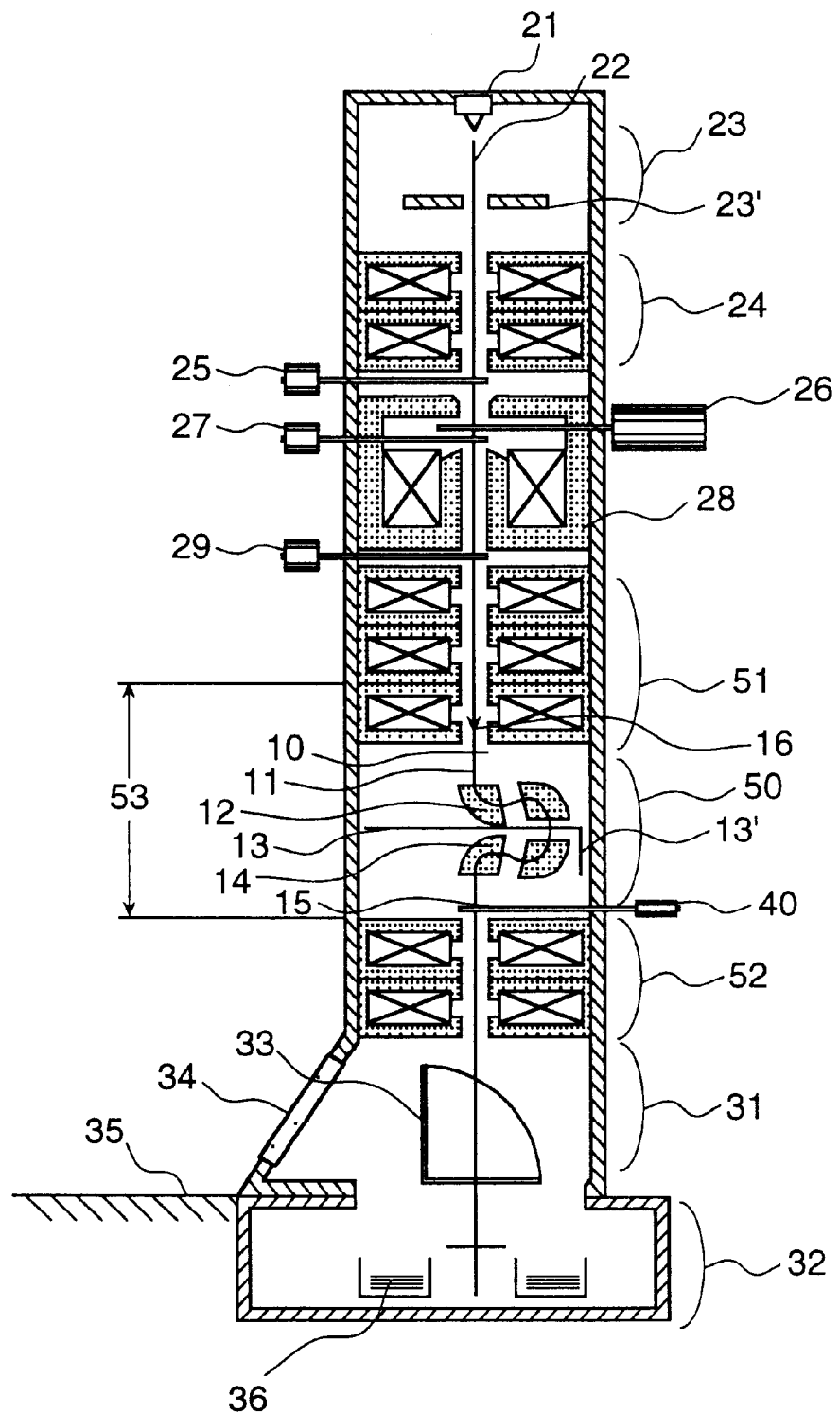
FIG. 5 is a sectional view of an electron microscope in which a conventional in-column type energy filter is incorporated.

In any one of the conventional in-column type energy filters represented by FIG. 5, although there is a symmetric plane 13 with respect to which the average track 11 of electron beam is symmetric, the angle $\theta$ between the incident direction 16 of the electron beam and the normal line 13' to the symmetric plane 13 is set to 0°.

Figure 6:
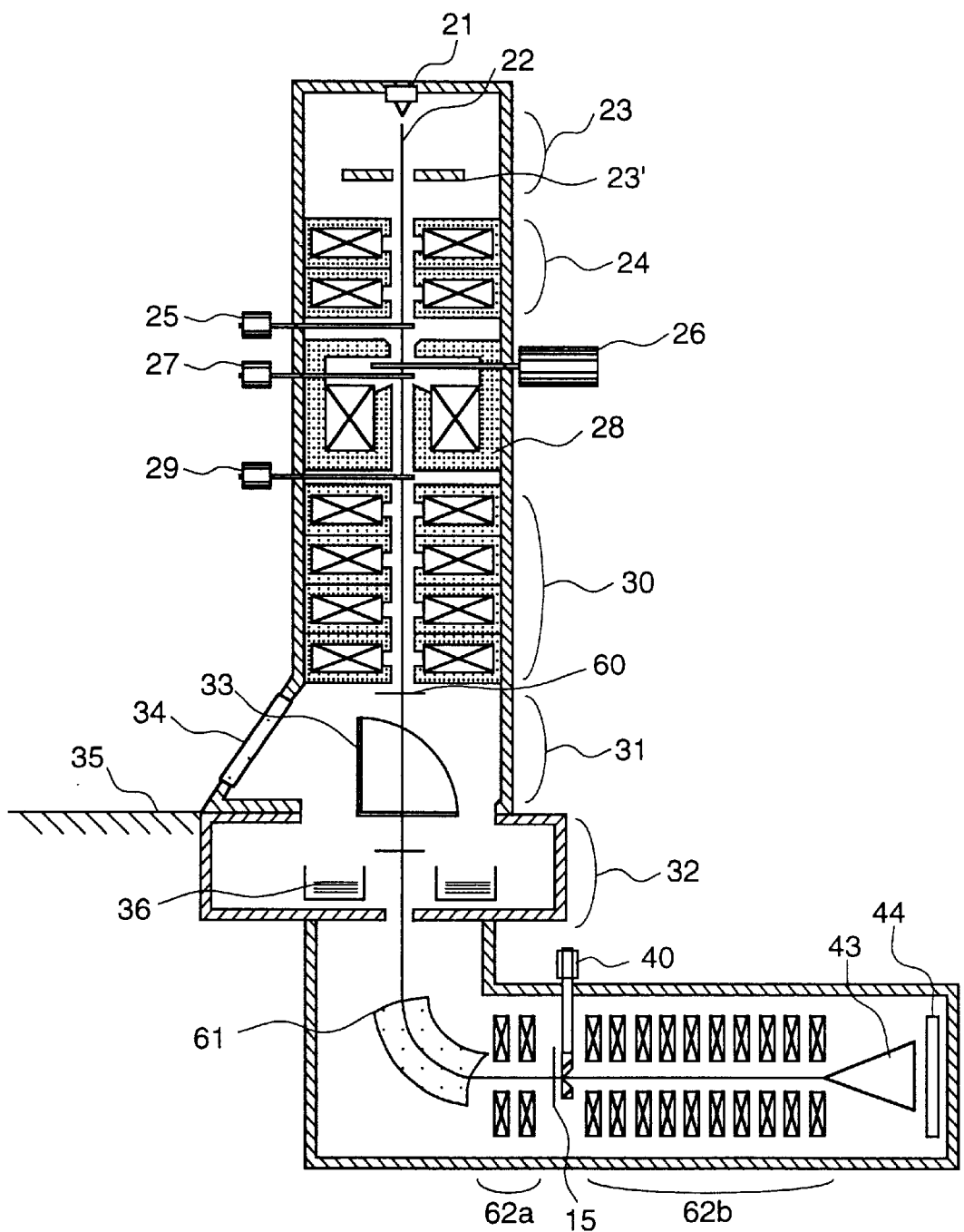
FIG. 6 is a sectional view of an electron microscope in which a conventional post-column type energy filter is incorporated.

Further, in the conventional post-column type energy filter shown in FIG. 6, since the energy filter employs a single magnetic sector 61, an achromatic image plane 14 as is present in the present invention does not exist on principle without complicated multipole lenses.

It is known that by making the electron track symmetric, many distortions of an image on the achromatic image plane can be reduced, and energy filters generating various electron tracks have been proposed. However, in all of those prior arts, a normal line to the symmetric plane was parallel to the incident direction of the electron beam. As in the present invention, as for the energy filter in which the normal line 13' to the symmetric plane is inclined against the incident direction 16, there is no calculation report and no study was done on whether or not it is applicable for an energy filter.

In order that the energy filter in which a plurality of magnetic poles are combined has a symmetric electron track and forms an achromatic image plane and an energy dispersion plane, studies using a calculation program and optimization of the shape are necessary. For example, the present invention is practiced by taking the following values for the electron track.

DL1=54 mm

DL2=53 mm

DL3=40 mm

R1=28 mm

R2=61 mm $\alpha$1=79°

$\alpha$2=124°

$\epsilon$1=35°

$\epsilon$2=7°

$\epsilon$3=7°

$\epsilon$4=18°

L=81 mm

Further, a deflection angle other than the above numeral values is suitable as energy filters to be in the following range:

$$60° \leq \alpha 1 \leq 85°$$

$$105° \leq \alpha 2 \leq 130°$$

Figure 2:
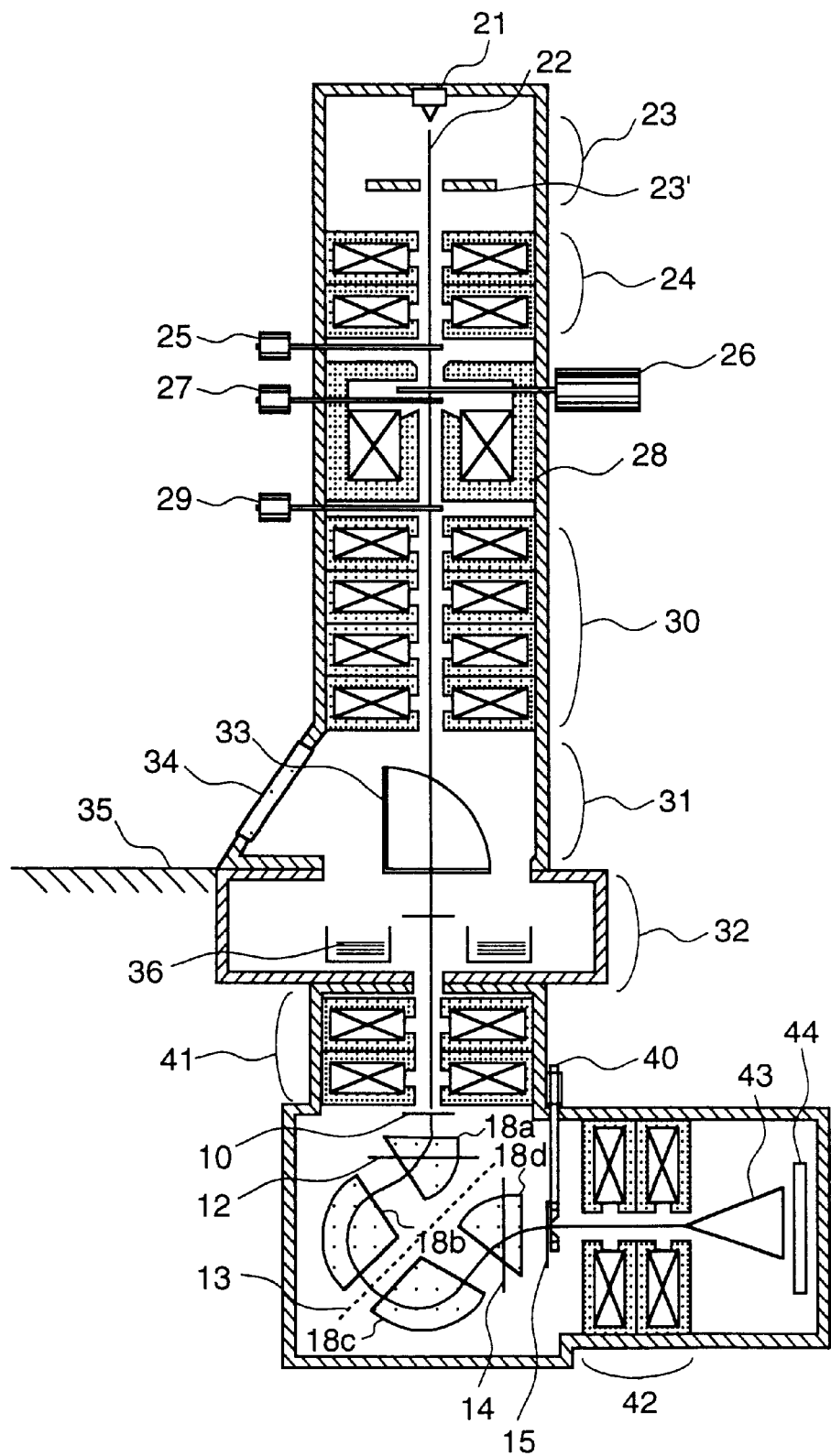
FIG. 2 is a sectional view of an embodiment of an electron microscope in which the energy filter according to the present invention is incorporated.

An embodiment of an electron microscope which is combined with the energy filter will be described, referring to FIG. 2.

In the present invention, an electron microscope and an energy filter instrument added thereto are provided.

First, the operation of the electron microscope is explained. An electron beam 22 emitted from an electron gun 21 is accelerated by an accelerating voltage device 23 and converged by a condenser lens system 24 and then falls on a specimen 26 mounted on a specimen holder. The electron beam, having transmitted through the specimen, is magnified by an objective lens 28 and an intermediate and projection lens system 30, projected on an image viewing means such as a fluorescent screen 33 provided in a viewing chamber 31, and observed. Alternatively, the electron beam 22 is projected and recorded on an image recording device 36 such as a photographic film for electron or an imaging plate, provided in a camera chamber 32. An operator observes an image projected on the fluorescent screen 33 through an observation window 34 and operates an operation panel.

Next, an energy filter instrument according to the present invention will be explained.

In the energy filter, first, an electron microscope image formed on the fluorescent screen 33 is projected on the incident image plane 12 of the energy filter, using a pre-filter lens system 41. In this case, it operates so that crossover is formed at the position of the crossover plane 10 of the energy filter. Within the energy filter, electrons generates a symmetric track 11 which is symmetric with respect to the symmetric plane 13 as shown in FIG. 1, and form the achromatic image plane 14 and the energy dispersion plane 15. On the energy dispersion plane 15, an energy slit 40 is provided. The energy slit 40 has a slit width made changeable and it is possible to retract the slit far away the electron beam track. The electron beam having transmitted through the energy slit 40 is magnified by a post-filter lens system 42, and then its electron microscope image 43 is projected on an image detector 44.

The post-filter lens system 42 has largely the following two different functions, as in the projection lens system 52 of the conventional in-column type energy filter. A first function is that the post-filter lens system 42 projects the image formed on the achromatic image plane 14 by the energy filter onto the image detector 44. In this case, an image formed by electrons of the energy selected by the energy slit 40, that is, an energy filtered image can be measured by the image detector 44. Another function is to project an image formed on the energy dispersion plane 15 by electrons onto the image detector 44. Since electron beams dispersed according to difference of energy are projected on the energy dispersion plane 15 as mentioned above, an energy loss spectrum is observed.

In this manner, in the present invention, the energy filter system which can be mounted under the column of the electron microscope later.

In general, an electron microscope is operated by an operator sitting on a chair while observing the fluorescent screen in the viewing chamber. Therefore, the height of the viewing chamber is generally set to from 70 cm to 100 cm. Further, the operation panel for the electron microscope is also set to approximately the same height (35). For reasons of human engineering in general, a space of the height of 60 cm or more is provided under the camera chamber 32. Therefore, the energy filter instrument can be set in the space. The size of the energy filter is sufficient to be 30–50 cm even if sufficient energy dispersion (1 $\mu$m/electron volt) is secured at 200–400 kV, for example, so that the energy filter instrument including the pre-filter lens system 41 can be sufficiently installed under the camera chamber 32.

On the other hand, since in the conventional energy filter, a final deflection angle is not 90°, there is not a sufficient space for disposing the projection lens system and the image detector in the rear of the energy filter and it is impossible to really install therein them. The energy filter of 90° deflection according to the present invention enables the energy filter instrument to be disposed in the space while keeping the symmetry of electron beams.

Further, the installation of the energy filter does not change the positions of the operation panel operated by an operator, a selected area aperture 29, an objective aperture 27, a condenser aperture 25 and the specimen holder 26, so that such an advantage is provided that the operability of the conventional instrument is not lost.

The installation of the energy filter instrument under the camera chamber 32 does not raise the position of the center of gravity of the whole instrument, so that it is unlikely to be influenced by mechanical vibrations which were one of large factors to degrade the spatial resolution upon observation of the electron microscope.

Further, since the height of the instrument is not made higher, any problem on the safety is not caused.

Further, since there is a margin left in the space under the camera chamber, the energy filter can be made further larger. In the conventional in-column type shown in FIG. 5, the size of the energy filter itself is influenced by the increment (53) of the height of the instrument, so that the size of the energy filter was restricted to a small one. This is one reason why the in-column type energy filter is difficult to be applied for a high accelerating voltage instrument. Because as the accelerating voltage becomes higher, a sufficient energy dispersion (that is, electron spectroscopy ability) can not be attained even if the same energy filter is used. In the present invention, for example, even an energy filter of the same size as the conventional in-column type energy filter of nearly 50 cm was too large to apply it can be installed, so that an energy filter of higher performance than the conventional energy filter or an energy filter for a high accelerating voltage can be provided.

Further, as for the energy filter according to the present invention, the conventional function of the electron microscope is not changed before and after installation of the energy filter, so that the conventional function of electron microscope is not lost. For the operator who takes a conventional operation method of the electron microscope, skillfulness of a new operation method accompanied by installation of the energy filter is not forced.

Further, in recent years, electron microscopes each are combined with options, and the energy filter can be combined with such various electron microscopes.

On the other hand, since the energy filter itself has an ability to correct aberration, it takes a simple construction without a multipole lenses, as compared with the conventional post-column type energy filter. Since the energy filter does not need complicated multipole lenses, the stability and operability of the instrument can be improved.

Figure 3:
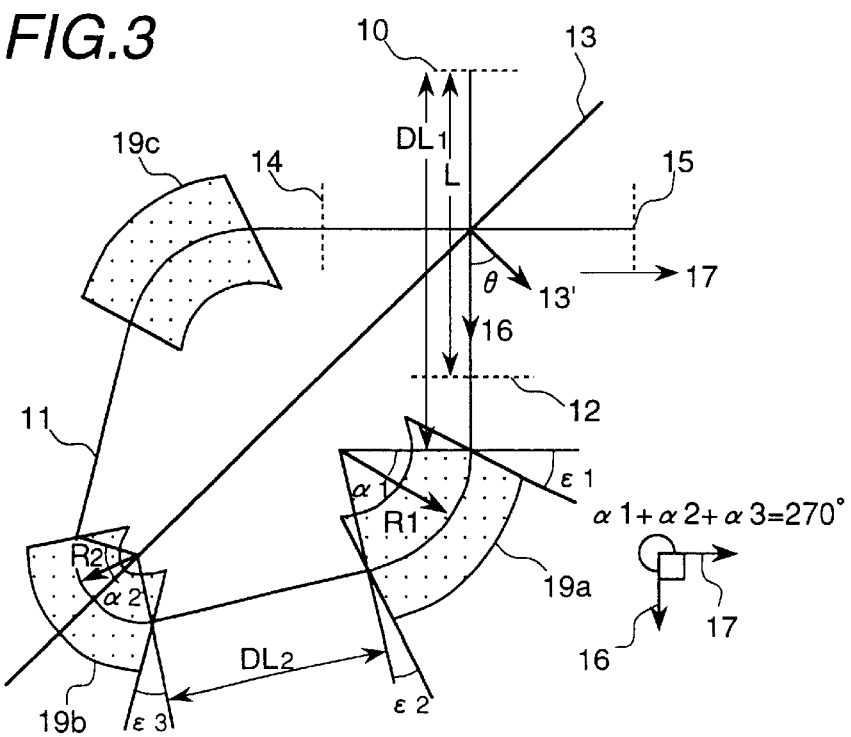
FIG. 3 is a schematic diagram of an energy filter of another embodiment of the present invention.

Another embodiment of the energy filter of the present invention is described, referring to FIG. 3. The energy filter of the present embodiment is composed of three electron spectrometers 19a, 19b, 19c. A desirable imaging energy filter can be provided by giving the shape parameters the following values, for example:

DL1=215 mm

L=142 mm

DL2=63 mm

R1=30 mm

R2=63 mm $\alpha$1=76.9°

$\alpha$2=116.2°

$\epsilon$1=29.5°

$\epsilon$2=13.4°

$\epsilon$3=33°

Figure 4A:
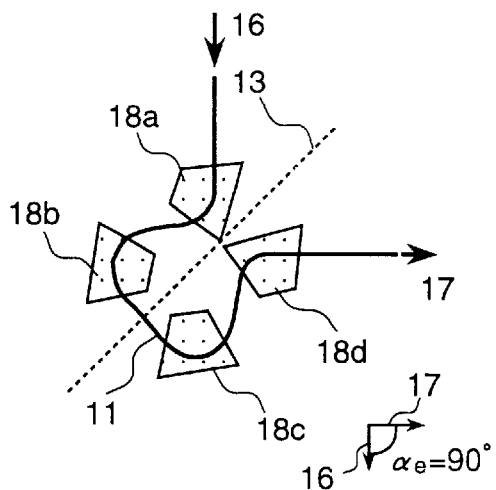
FIGS. 4(a) to 4(d) each are a schematic diagram of an electron track formed according to the present invention.
Figure 4B:
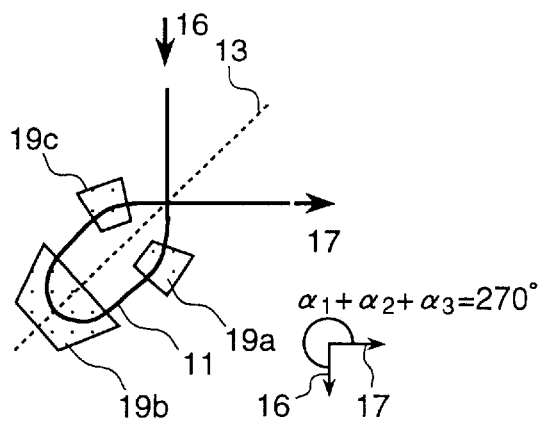
Figure 4C:
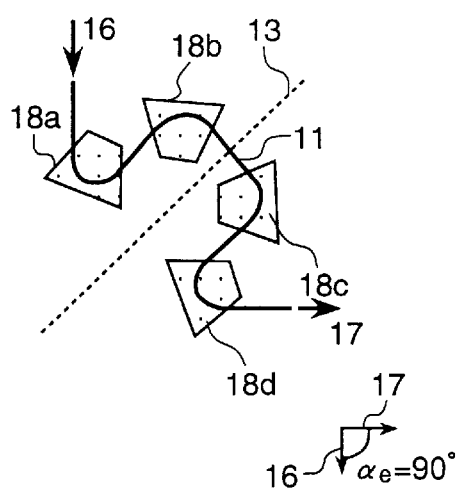
Figure 4D:
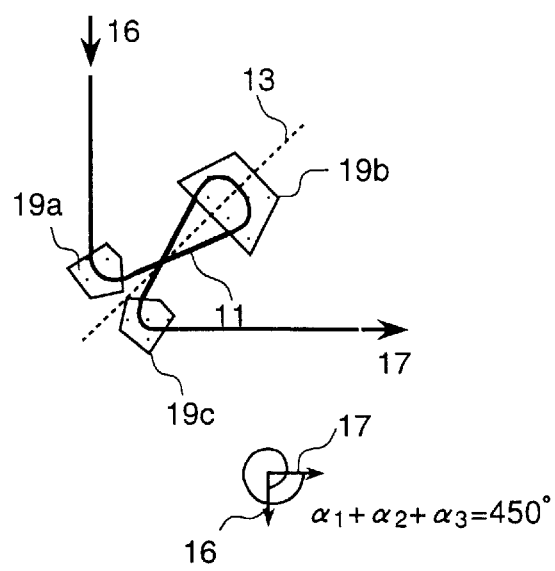

FIGS. 4(a) to 4(d) each show an embodiment of an electron track which can be thought. FIGS. 4(a) and 4(b) are schematic diagrams showing the energy filters shown in FIGS. 1 and 3, respectively. FIGS. 4(c) and 4(d) each show another electron track according to the present invention.

Further, in the above embodiments, although magnetic sectors each of which generates a uniform magnetic field are used as electron spectrometers, the electron spectrometer is not limited to them, for example the same effect can be obtained by a combination of an electrostatic mirror and a magnetic sector, or by using sectors generating inhomogenious magnetic fields. Further, it can be obtained by combining multipole lenses other than the magnetic sectors.

Further, aberration can be greatly reduced by providing curved faces in the pole face.

Figure 7A:
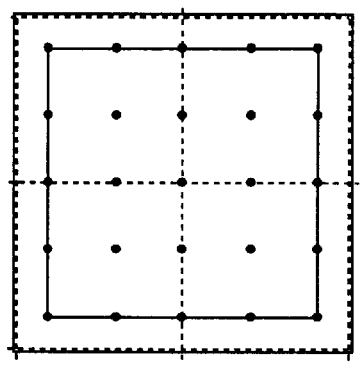
FIGS. 7(a) to 7(c) are views for the explanation of the difference in an observation image plane when passed through a conventional energy filter and the energy filter according to the present invention, wherein FIG. 7(a) show a grating pattern of an incident image plane.
Figure 7B:
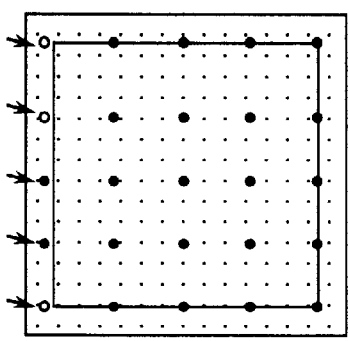
Figure 7C:
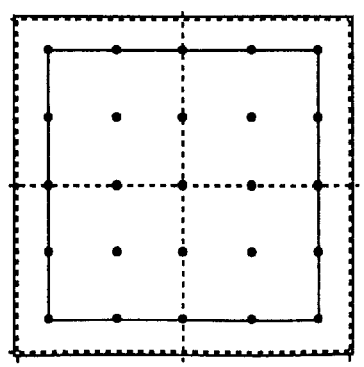

FIGS. 7(a) to 7(c) are for comparison with the conventional post-column type energy filter to show an effect of practice of the present invention in more detail. FIG. 7(a) shows a test pattern (a) of an incident image plane, FIG. 7(b) shows an example (b) of an energy filter image obtained by the conventional post-column type energy filter, and FIG. 7(c) shows an example (c) of an energy filter image according to the present invention. In an example of an operation by the present invention (FIG. 7(c)), calculation was effected, using the above-mentioned shape parameter set values (I) for an electron filter and setting magnification of the post-filter lens system 42 to 100 times. For the calculation, the program in the previously mentioned papers (T. Matuo, et al: Mass Spectroscopy 24 (1976) 19–62) was used.

In an example of observation by the conventional post-column type energy filter (FIG. 7(b), an image of a grating shape was projected with distortion. This is inherently to be observed as a square-shaped grating pattern as viewed in an incident image plane in FIG. 7(a), but the shape is because of the distortion caused due to aberration of the filter. In this example, in particular, the pattern is distorted so as to be extended laterally, as shown by arrows. This main cause is that the distortion is large in a single magnetic sector. Further, since the multipole lens group for correcting the distortion is not an axis-symmetric lenses, such a case that magnification differs between the lateral and vertical directions can very often occur. Further, the portion indicated by the arrows are distorted in concave toward the left side. In this manner, in the conventional post-column type energy filter, inherently, image distortion is large. In order to correct the distortion, it is difficult to do it by simply focusing, so that it is necessary to operate a plurality of lenses among six stages of quadrupole lenses and six stage sextupole lenses, however the operation is very difficult.

On the other hand, in the embodiment shown in FIG. 7(c), the distortion of a ratio of length and breadth observed in the prior art shown in FIG. 7(b) can not be observed. Further, it is noted that such distortion as curved in a concave does not occur. The reason that such an excellent property appears is that the energy filter itself has a function of correcting the aberration by providing the electron track with symmetry.

Table 1 lists performance obtained by calculation of energy filters (a) and (b) to express in detail effects of practice of the present invention in comparison with the conventional in-column type energy filter. (a) is an example

TABLE 1

| Filter Shape | (a) Example of Conventional Type | (b) Example of Invention | Target |
|---|---|---|---|
| Primary aberration coefficient on energy dispersion plane: AA | −0.28 | −0.28 | The smaller absolute value, the better. |
| Primary aberration coefficient on an achromatic image plane: XX | 147. | 101. | |
| Energy dispersion D | 0.18 | 0.19 | The larger, the better. |
| Performance (D · L$^2$/|AA|) M | 1.23 × 10$^3$ | 4.36 × 10$^3$ | The larger, the better. |

Figure 8A:
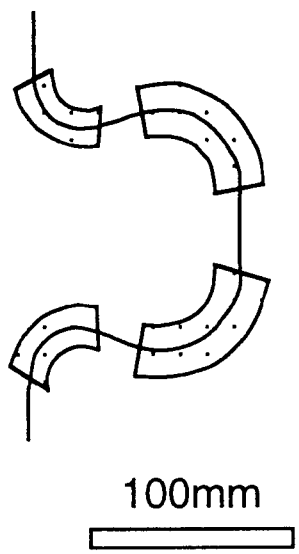
Figure 8B:
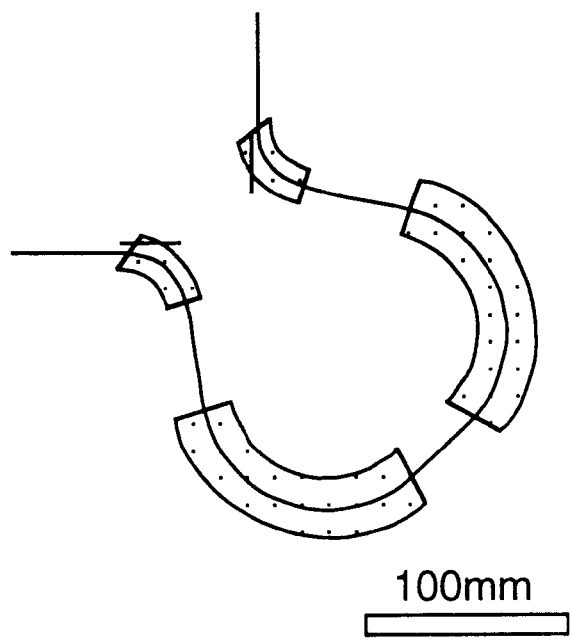

(Note: L is distance (mm) between the crossover and the incident image plane.)

of arrangement of magnetic sectors, as shown in FIG. 8(a), (b) is an arrangement of magnetic poles determined by the shape parameter setting (I) of the present invention, as shown in FIG. 8(b). As shown in the table 1, according to the present invention, it is noted that under the condition AA which is a main aberration coefficient on the energy dispersion plane is held small, the aberration coefficient XX expressing distortion on the achromatic image plane can be made smaller than the conventional one and energy dispersion D is made large. When a distance between the crossover and the incident image plane is set to L, a parameter M representative of the performance of an energy filter is expressed as M=D X L$^2$/|AA|, and it noted that the parameter M is improved greatly as compared with the conventional energy filter.

The reason that such an excellent energy filter is provided by the present invention is that since under the condition the symmetry of the electron track is kept the filter can be post-column type, the filter design can be made free from large restriction and the filter shape can be optimized.

As mentioned above, the present invention solves many problems of the conventional energy filter for electron microscope and achieves the following new effects. Hereunder, the effects are described comparing with the conventional energy filter.

(1) An energy filter of simpler construction than the conventional energy filter can be provided.
(2) The operability becomes better since the construction is simpler than the conventional post-column type energy filter.
(3) An image of small distortion can be obtained by less structure components than the conventional post-column type energy filter.

Further, the following new effects are achieved, comparing another type of energy filter, that is, an in-column type energy filter.
(1) A decrease in operability caused by elevation of the height and a decrease in safety due to elongation of the instrument, which were a problem in the in-column type energy filter, are solved.
(2) Further, since in the in-column type energy filter, the position of the specimen becomes high, it was apt to be influenced by mechanical vibrations, however, the energy filter according to the present invention is difficult to be subjected to such vibrations.
(3) Since almost all the problems concerning the size are solved, the performance of the electron spectrometer is improved by a large-sized energy filter.

In the present invention, an electron microscope itself is unnecessary to be modified, so that the invention can be applied to various methods using the electron microscope without modification of the invention. For example, a new electron detecting means can be provided for various methods including electron holography using electron beam biprism, a ultra-low temperature electron microscope method for preventing radiation damage of specimen, scanning transmission electron microscope method for observing an image by operating a converged electron beam.

The present invention aims to disperse and select electrons of different energy on the energy dispersion plane and observe an energy-filtered image in the achromatic image plane. On the other words, for the energy filter, it is necessary to form the energy dispersion plane and the achromatic image plane at different positions at the same time.

What is claimed is:

1. An energy filter in which electrons emitted from a crossover plane form an energy dispersion plane, the electrons emitted from an entrance image plane form an achromatic image plane, and an average track of an electron beam is symmetric with respect to a symmetric plane, wherein a normal line to said symmetric plane is inclined to an incident direction of the electron beam at an angle of θ and the angle θ is in a range of 0°<θ<180°.

2. An energy filter according to claim 1, wherein the angle θ between the normal line to said symmetric plane and said incident direction of electron beam is 45°.

3. An energy filter according to claim 1, wherein n (n is at least two) electron spectrometers are provided, and have respective deflection angles α1, α2 . . . αn by which they deflect the electron beam, said deflection angles having the following relationships α1=αn, α2=αn−1 . . . and a final deflected angle αe which is 0°<αe <180°.

4. An energy filter according to claim 3, wherein said final deflected angle αe is 90°.

5. A energy filter according to claim 1, wherein a plurality of electron dispersing means are provided to impart four deflections to an electron beam, and angles (α1, α2, α3, α4) of deflection of the electron beam caused by said electron dispersing means have the following relationships;

α1=α4 and α2=α3, 30°≦α1≦135°, 60°≦α2≦180° and α1<α2.

6. A energy filter according to claim 5, wherein 60°≦α1≦85°, 105°≦α2≦130°.

7. A energy filter according to claim 5, wherein the final deflection angle αe is 90°.

8. An energy filter according to claim 1, wherein a plurality of electron dispersing means are provided to impart three deflections to an electron beam, and angles (α1, α2, α3) of deflection of the electron beam caused by said electron dispersing means having the following relationship;

α1=α3, and 30°≦α1≦135°.

9. An energy filter according to claim 8, wherein the sum of α1+α2+α3 is 270° or 450°.

10. An electron microscope comprising an electron gun, an accelerating voltage device for accelerating an electron beam emitted from said electron gun, a condenser lens system irradiating the electron beam on a specimen, intermediate and projection lens systems for forming an image or diffraction pattern of the specimen, and a viewing chamber or camera chamber provided with means for observing or recording said image or diffraction pattern, wherein said energy filter according to claim 1 is provided in the rear of said viewing chamber or camera chamber.

11. An energy filter system for an electron microscope, having an energy filter according to claim 1 and a structure able to be installed under a viewing chamber or camera chamber of the electron microscope.

12. An energy filter system having an energy filter according to claim 1, wherein at least a lens for electron is provided between said energy filter and an image detector.

13. An energy filter system for an electron microscope, having an energy filter according to claim 1, wherein at least a lens for electron is provided between said energy filter and said electron microscope.

14. An energy filter system for an electron microscope according to claim 13, wherein a lens system provided between said energy filter and said electron microscope has a function of reducing the size of an image formed by said electron microscope and projecting the image on an incident image plane of said energy filter.

15. An energy filter which comprises at least one electron spectrometer and has a course of curved axis of an electron beam which is symmetric with respect to a symmetric plane, wherein a normal line to said symmetric plane is inclined to an incident direction of the electron beam at an angle of θ and the angle θ is in a range of 0°<θ<180°.

* * * * *